United States Patent
Sorg et al.

(10) Patent No.: US 11,870,214 B2
(45) Date of Patent: *Jan. 9, 2024

(54) SEMICONDUCTOR LASER AND METHOD OF PRODUCTION FOR OPTOELECTRONIC SEMICONDUCTOR PARTS

(71) Applicant: OSRAM OLED GmbH, Regensburg (DE)

(72) Inventors: Jörg Erich Sorg, Regensburg (DE); Harald König, Bernhardswald (DE); Alfred Lell, Maxhütte—Haidhof (DE); Florian Peskoller, Ingolstadt (DE); Karsten Auen, Regensburg (DE); Roland Schulz, Regensburg (DE); Herbert Brunner, Sinzing (DE); Frank Singer, Regenstauf (DE); Roland Hüttinger, Kaufering (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/971,156

(22) Filed: Oct. 21, 2022

(65) Prior Publication Data

US 2023/0068945 A1   Mar. 2, 2023

Related U.S. Application Data

(62) Division of application No. 16/754,723, filed as application No. PCT/EP2018/077313 on Oct. 8, 2018.

(30) Foreign Application Priority Data

Oct. 12, 2017 (DE) ..................... 10 2017 123 798.4

(51) Int. Cl.
  *H01S 5/028* (2006.01)
  *H01S 5/0236* (2021.01)
  (Continued)

(52) U.S. Cl.
  CPC ............ *H01S 5/028* (2013.01); *H01S 5/0236* (2021.01); *H01S 5/02253* (2021.01);
  (Continued)

(58) Field of Classification Search
  None
  See application file for complete search history.

(56) References Cited

U.S. PATENT DOCUMENTS 4,001,719 A * 1/1977 Krupka ................. H01S 5/1082
                                                        372/49.01
5,081,639 A * 1/1992 Snyder .................... H01S 5/026
                                                          359/720

(Continued)

FOREIGN PATENT DOCUMENTS

CN    1637451 A    7/2005
CN    1673786 A    9/2005
(Continued)

OTHER PUBLICATIONS

International Search Report and Written Opinion in corresponding International Application No. PCT/EP2018/077313 dated Dec. 14, 2018, 11 pages.

(Continued)

*Primary Examiner* — Joshua King
(74) *Attorney, Agent, or Firm* — MH2 TECHNOLOGY LAW GROUP LLP (57) ABSTRACT

In one embodiment the semiconductor laser comprises a carrier and an edge-emitting laser diode which is mounted on the carrier and which comprises an active zone for generating a laser radiation and a facet with a radiation exit (Continued)

region. The semiconductor laser further comprises a protective cover, preferably a lens for collimation of the laser radiation. The protective cover is fastened to the facet and to a side surface of the carrier by means of an adhesive. A mean distance between a light entrance side of the protective cover and the facet is at most 60 µm. The semiconductor laser is configured to be operated in a normal atmosphere without additional gas-tight encapsulation.

13 Claims, 8 Drawing Sheets

(51) Int. Cl.
*H01S 5/02253* (2021.01)
*H01S 5/02326* (2021.01)
*H01S 5/00* (2006.01)

(52) U.S. Cl.
CPC ........ *H01S 5/02326* (2021.01); *H01S 5/0078* (2013.01); *H01S 5/0087* (2021.01)

(56) References Cited

U.S. PATENT DOCUMENTS

| | | | | |
|---|---|---|---|---|
| 5,084,895 | A * | 1/1992 | Shimada | G02B 6/4204 372/50.23 |
| 5,226,052 | A * | 7/1993 | Tanaka | H01S 5/02325 257/82 |
| 5,274,732 | A * | 12/1993 | Farnand | G02B 7/02 359/813 |
| 5,414,293 | A * | 5/1995 | Broom | G02B 6/4202 257/667 |
| 5,420,722 | A * | 5/1995 | Bielak | G02B 6/4204 359/708 |
| 5,430,750 | A * | 7/1995 | Tanimoto | H01S 5/028 372/49.01 |
| 5,465,265 | A * | 11/1995 | Ota | G02B 19/0057 372/50.23 |
| 5,544,184 | A * | 8/1996 | Wolak | G02B 6/4204 372/50.23 |
| 5,553,089 | A * | 9/1996 | Seki | H01S 5/4025 372/50.23 |
| 5,757,830 | A * | 5/1998 | Liau | G02B 6/4204 372/109 |
| 6,836,500 | B2 * | 12/2004 | Borchert | G02B 6/4204 372/75 |
| 7,419,839 | B2 * | 9/2008 | Camras | H01L 33/58 438/22 |
| 2003/0007257 | A1 * | 1/2003 | Bell, Jr. | H01S 5/0267 359/618 |
| 2003/0219211 | A1 * | 11/2003 | Kim | G02B 6/4204 385/33 |
| 2004/0036135 | A1 * | 2/2004 | Yang | G02B 6/4239 257/433 |
| 2006/0186500 | A1 * | 8/2006 | Stephens | H01S 5/4018 257/706 |
| 2007/0086501 | A1 | 4/2007 | Karlsen | |
| 2008/0205464 | A1 * | 8/2008 | Michiue | H01S 5/028 372/44.011 |
| 2009/0086769 | A1 * | 4/2009 | Minamio | G11B 7/127 372/5 |
| 2010/0002739 | A1 * | 1/2010 | Hu | H01S 1/02 372/45.01 |
| 2010/0158067 | A1 * | 6/2010 | Nakatsuka | H01S 5/12 372/50.23 |
| 2011/0164643 | A1 * | 7/2011 | Tohyama | H01S 5/028 372/49.01 |
| 2013/0001627 | A1 * | 1/2013 | Kinoshita | H01S 5/0087 257/E33.073 |
| 2014/0044436 | A1 | 2/2014 | Lee et al. | |
| 2014/0361153 | A1 * | 12/2014 | Motohara | H01S 5/02251 250/216 |
| 2015/0244147 | A1 * | 8/2015 | Stojetz | H01S 5/0286 372/49.01 |
| 2015/0244148 | A1 * | 8/2015 | Schwarz | H01S 5/02253 438/27 |
| 2015/0380896 | A1 * | 12/2015 | Kimura | H01S 5/02326 359/641 |
| 2016/0064895 | A1 * | 3/2016 | Ishige | H01S 5/02326 359/811 |
| 2017/0170629 | A1 * | 6/2017 | Lerner | G02B 19/0052 |
| 2017/0276942 | A1 * | 9/2017 | Price | G02B 19/0061 |
| 2018/0003927 | A1 * | 1/2018 | Wu | G02B 7/006 |
| 2018/0375294 | A1 * | 12/2018 | Hashimoto | H01S 5/1237 |
| 2019/0273365 | A1 * | 9/2019 | Zediker | H01S 3/094046 |

FOREIGN PATENT DOCUMENTS

| | | | |
|---|---|---|---|
| CN | 101779151 A | 7/2010 | |
| CN | 102872779 A | 1/2013 | |
| CN | 108400520 A | 8/2018 | |
| CN | 108604765 A | 9/2018 | |
| DE | 19640423 C1 | 3/1998 | |
| DE | 19706276 A1 | 8/1998 | |
| DE | 102004014355 A1 | 10/2005 | |
| DE | 102007063438 A1 | 6/2009 | |
| DE | 102009040834 A1 | 5/2011 | |
| DE | 102012215684 A1 | 3/2014 | |
| DE | 102012217652 A1 | 3/2014 | |
| DE | 102013205594 A1 | 10/2014 | |
| DE | 102016101942 A1 | 8/2017 | |
| DE | 102018106959 A1 | 9/2019 | |
| DE | 102018128751 A1 | 5/2020 | |
| EP | 0562754 A1 | 9/1993 | |
| EP | 1727249 B1 * | 2/2014 | ............... G02B 1/18 |
| EP | 2720326 A1 | 4/2014 | |
| JP | S553668 A | 1/1980 | |
| JP | 02262389 A | 10/1990 | |
| JP | H0334387 A | 2/1991 | |
| JP | H05134150 A | 5/1993 | |
| JP | H05160518 A | 6/1993 | |
| JP | H05206578 A | 8/1993 | |
| JP | H08191172 A | 7/1996 | |
| JP | 2001242357 A | 9/2001 | |
| JP | 2003059087 A | 2/2003 | |
| JP | 2003519812 A | 6/2003 | |
| JP | 2003207601 A | 7/2003 | |
| JP | 2004072004 A | 3/2004 | |
| JP | 2004103792 A | 4/2004 | |
| JP | 3566979 B2 | 9/2004 | |
| JP | 2007157961 A | 6/2007 | |
| JP | 3975066 B2 | 9/2007 | |
| JP | 04003989 A | 11/2007 | |
| JP | 2008146750 A | 6/2008 | |
| JP | 2009099664 A | 5/2009 | |
| JP | 2009260118 A | 11/2009 | |
| JP | 2011003889 A | 1/2011 | |
| JP | 2011119699 A | 6/2011 | |
| JP | 2012212734 A | 11/2012 | |
| JP | 2013084984 A | 5/2013 | |
| JP | 2014232790 A | 12/2014 | |
| JP | 2016225448 A | 12/2016 | |
| KR | 19980085718 A | 12/1998 | |
| KR | 1020140021483 | 2/2014 | |
| WO | 9206521 A1 | 4/1992 | |
| WO | 9624874 A1 | 8/1996 | |
| WO | 2003077389 A1 | 7/2005 | |
| WO | 2009041462 A1 | 4/2009 | |
| WO | 2010050265 A1 | 5/2010 | |
| WO | 2011128233 A1 | 10/2011 | |
| WO | 2011074215 A1 | 4/2013 | |
| WO | 2014154662 A | 10/2014 | |
| WO | 2014192939 A1 | 12/2014 | |
| WO | 2016060615 A1 | 4/2016 | |
| WO | 2017134244 A1 | 8/2017 | |

(56) References Cited

FOREIGN PATENT DOCUMENTS

| | | |
|---|---|---|
| WO | 2018184697 A1 | 10/2018 |
| WO | 2020016185 A1 | 1/2020 |

OTHER PUBLICATIONS

Korean Office Action in corresponding Korean Application No. 10-2020-7013145 dated Mar. 29, 2021, 17 pages.
Japanese Notice of Reasons for Rejection in corresponding Japanese Application No. 2020-519069 dated May 18, 2021, 17 pages.
Korean Examination Notice (with English Translation) in corresponding Korean application No. 10-2020-7013145 dated Oct. 12, 2021, 14 pages.
Japanese Decision to Grant Patent (with English Translation) in corresponding Japanese Application No. 2020-519069 dated Dec. 14, 2021, 4 pages.
Chinese Office issued in Chinese Application No. 2018800664738 dated Jul. 11, 2023, with English language translation attached, 10 pages.

* cited by examiner

SEMICONDUCTOR LASER AND METHOD OF PRODUCTION FOR OPTOELECTRONIC SEMICONDUCTOR PARTS

CROSS-REFERENCE TO RELATED APPLICATION(S)

This application is a divisional application of U.S. patent application Ser. No. 16/754,723, filed Apr. 8, 2020, now allowed, which is a national stage entry from International Application No. PCT/EP2018/077313, filed on Oct. 8, 2018, published as International Publication No. WO 2019/072759 on Apr. 18, 2019, and claims priority under 35 U.S.C. § 119 from German Patent Application No. 102017123798.4, filed on Oct. 12, 2017, the disclosures of all of which are hereby incorporated herein by reference in their entireties.

TECHNICAL FIELD

A semiconductor laser is provided. Further, a production method for optoelectronic semiconductor components is provided.

BACKGROUND

An object to be achieved is to provide an optoelectronic semiconductor component that can be efficiently encapsulated and efficiently produced.

This object is achieved, inter alia, by a semiconductor laser and by a production method with the features of the independent claims. Preferred developments are the subject matter of the dependent claims.

SUMMARY

According to at least one embodiment, the semiconductor laser comprises a carrier. The carrier can be a so-called submount.

It is possible for the carrier to comprise a driver with which the semiconductor laser can be controlled.

Alternatively, it is possible for the carrier to represent an electronically passive component and to serve just as a mounting plane.

According to at least one embodiment, the semiconductor laser comprises one or more laser diodes. The at least one laser diode is preferably an edge-emitting laser diode. This means in particular that a laser radiation generated during operation is emitted in the direction parallel to an active zone of the laser diode.

According to at least one embodiment, the laser diode comprises a facet. The facet is preferably oriented perpendicular or approximately perpendicular to the active zone. A radiation exit region is located on the facet. The laser radiation generated during operation emerges from the laser diode at the radiation exit region. The radiation exit region is in particular restricted to a partial region of the facet and thus to the facet.

According to at least one embodiment, the semiconductor laser comprises one or more protective covers, in particular exactly one protective cover. The protective cover is preferably an optical unit for beam shaping or beam deflection, but can also be an optically inactive body such as a disk, for example, a plane-parallel plate.

In particular, the protective cover is a lens which is preferably designed for collimation or focusing of the generated radiation. The lens can be spherical, aspherical or in the form of a free form. Furthermore, a cylindrical lens or half-cylinder lens is possible. The protective cover may be a converging lens. The protective cover can be designed, for example, as a plano-convex lens or biconvex lens. An embodiment as a Fresnel lens is also possible. Furthermore, the protective cover can be a prism, for example, for a beam deflection.

According to at least one embodiment, the protective cover is made of an inorganic material such as a glass or sapphire or SiC. Alternatively and less preferably, the protective cover is made of an organic material such as a plastic, for example, a silicone or an epoxy or a hybrid material thereof, or else of a polymer such as polycarbonate. If the protective cover is made of an organic material, this organic material preferably forms a core of the protective cover, which can be covered in particular over the entire surface and all around by an inorganic protective layer, for example, as a diffusion barrier against oxygen and/or water vapor.

According to at least one embodiment, the semiconductor laser comprises an adhesive. The protective cover is attached to the facet and optionally also to a lateral surface of the carrier by means of the adhesive. The side surface of the carrier can be oriented parallel or approximately parallel to the facet. The side surface of the carrier is preferably set back with respect to the facet, along a beam direction of the laser radiation. Thus, the protective cover is preferably attached to the facet and to the carrier with the adhesive. The adhesive is preferably an inorganic material such as a glass or at least one metal.

Alternatively, the adhesive is a plastic such as a silicone, poly-siloxane, poly-silazane or a silicone hybrid material, preferably a low-organic plastic. Poly-siloxane means that the material is built of $-[O-SiR_2]_n-$, in the case of poly-silazane of $-[NH-SiR_2]_n-$, wherein it is possible for different moieties R to be present in each case. Low-organic means, for example, that a proportion of organic constituents on the silicone, siloxane or silazane is not more than 30% by mass or 20% by mass and/or that, in particular in the case of a siloxane or silazane, a quotient of a number of carbon-containing moieties R and of n is at most 0.75 or 0.25. The mass proportion of the organic matter is determined in particular by asking the material.

Less preferably, the adhesive may be of an organic material such as an epoxy and/or a polymer of carbon-containing structural units.

According to at least one embodiment, an average distance between a light entrance side of the protective cover and the facet is at most 5 µm or 15 µm or 30 µm or 60 µm or 0.1 mm Alternatively or additionally, this average distance is at least 0.1 µm or 0.5 µm. The average distance is preferably in the range between 0.5 µm and 5 µm. In other words, the protective cover may be close to the facet.

According to at least one embodiment, the semiconductor laser is configured to be operated in a normal atmosphere without additional gas-tight encapsulation. That is, encapsulation and protection of the facet, in particular of the radiation exit region, takes place by means of the adhesive together with the protective cover. Due to the adhesive together with the protective cover, the semiconductor laser can preferably be operated in normal ambient air, wherein the ambient air can contain an oxygen content in the range around 21% and water vapor.

In at least one embodiment, the semiconductor laser comprises a carrier and an edge-emitting laser diode which is mounted on the carrier and which comprises an active zone for generating a laser radiation and a facet with a radiation exit region. The semiconductor laser further comprises a protective cover, preferably a lens for collimating the laser radiation. The protective cover is fastened to the facet and to a lateral surface of the carrier by means of an adhesive. An average distance between a light entrance side of the protective cover and the facet is at most 60 µm. The semiconductor laser is configured to be operated in a normal atmosphere without additional gas-tight encapsulation.

In particular, semiconductor lasers having a high power output, for example, above 0.2 W or 1 W of optical output power, and which emit at short wavelengths in the near ultraviolet or in the blue spectral range, are to be protected and encapsulated against environmental influences. In order to be able to ensure stable operation in the long term, corresponding laser diodes must be operated in a clean, hermetically encapsulated atmosphere or kept away from any atmosphere.

In the semiconductor laser described here, a hermetic partitioning of the radiation exit region takes place by means of a cladding close to the facet. An otherwise required, hermetically sealed housing can be dispensed with by the encapsulation close to the facet, formed by the protective cover together with the adhesive. As a result, the semiconductor laser can be produced more cost-effectively and can be installed with a reduced space requirement.

The protective cover, in particular together with the adhesive, protects the facet against environmental influences and reduces the beam divergence of the laser radiation. Likewise, by means of the protective cover, for example, in the form of a lens, an enlargement of a surface to which possible decomposition products can deposit is effected. Furthermore, the enlargement of the surface of the semiconductor laser, which is exposed to an atmosphere, results in a reduction of an optical power density, accompanied by a reduction of an effect of an optical tweezers. In particular, the protective cover prevents particles and/or inorganic molecules from accumulating directly on the laser facet and at the radiation exit region.

Deposits on the facet can be decomposed, in particular, by short-wave radiation and can burn in. Such changes in the region of the facet cause a decoupling efficiency of the laser to decrease and damage to a facet coating can occur, for example, by optical absorption in the deposits, which in turn can lead to overheating and thus to destruction of the entire laser facet region. This is also referred to as catastrophic optical damage, COD for short. The protective cover mounted in the facet region prevents particles and/or molecules from being deposited on the facet while at the same time having a simple construction of the semiconductor laser and reduced space requirement.

In addition, the divergence of the emitted laser radiation is reduced by the lens close to the facet. Likewise, the field strength in the region of the laser beam running on the atmosphere is reduced. The field strength in the divergent beam could otherwise suck potential contaminations in the vicinity of the facet and cause deposition thereof on the facet, corresponding to an optical tweezers. In this way, a reduction in the beam divergence leads directly to a reduction of the deposits.

Furthermore, an interface to the atmosphere is enlarged by the protective cover, that is, preferably by the lens. As a result of the enlargement of the boundary surface, the amount of potential deposits per unit area decreases. In addition, the energy density at this interface is reduced in relation to the facet directly.

According to at least one embodiment, the laser diode is hermetically sealed by the adhesive and the protective cover. That is, between an interior and an exterior of the encapsulation formed from the adhesive along with the protective cover, there is no significant exchange of substances such as oxygen or water vapor. For example, hermetically sealed means that a leak rate is at most $5 \times 10^{-9}$ Pa m/s, in particular at room temperature.

According to at least one embodiment, a minimum distance between the protective cover and the facet is 0.1 µm or 0.2 µm. Alternatively or additionally, this minimum distance is at most 10 µm or 5 µm or 3 µm. That is, the minimum distance may be on the order of the wavelength of the laser radiation. As a result, it is possible for the region between the protective cover and the facet to act as an undesired, additional resonator. On the other hand, this small minimum distance results in only small diffusion cross-sectional areas occurring towards the radiation exit region, in particular through the adhesive.

According to at least one embodiment, a cavity is formed on the facet in the region of the active zone. Seen in plan view of the facet, the cavity is enclosed all around by the adhesive. Thus, the radiation exit region in which the laser radiation leaves the laser diode can be free of the adhesive. This does not result in a potentially damaging interaction between the laser radiation and the adhesive directly at the radiation exit region.

According to at least one embodiment, the cavity is evacuated or filled with one or more protective gases. A corresponding protective gas is, for example, a noble gas such as argon or helium or an inert gas such as nitrogen. If the cavity is filled with protective gas, a gas pressure in the cavity can be close to a normal atmospheric pressure, in particular between 0.8 bar and 1.1 bar inclusive, for example, at an intended operating temperature of the semiconductor laser.

According to at least one embodiment, the cavity, seen in plan view of the facet, has an average diameter of at least 3 µm or 5 µm or 10 µm and/or of at most 0.1 mm or 50 µm or 20 µm or 10 µm. In other words, the cavity can be comparatively small as seen in plan view.

The cavity can be formed rotationally symmetrically to the radiation exit region or extend asymmetrically around the radiation exit region. A distance between the adhesive and the radiation exit region is preferably at least 2 µm or 5 µm or 10 µm.

According to at least one embodiment, a thickness of the cavity is between 0.5 µm and 20 µm inclusive. The thickness of the cavity perpendicular to the facet can correspond to the mean distance between the radiation exit region and/or the side surface of the carrier on the one hand and the light entrance side of the protective cover on the other hand.

According to at least one embodiment, seen in plan view of the facet, a width of the adhesive around the cavity is at least 100% or 150% or 250% of the average diameter of the cavity. Alternatively or additionally, the width of the adhesive is at least 20 µm or 30 µm or 50 µm and/or at most 0.1 mm or 50 µm or 20 µm.

According to at least one embodiment, the cavity has side walls that are curved towards the adhesive. For example, seen in cross section perpendicular to the facet, the cavity has a biconvex shape at the radiation exit region. That is, seen in this cross-section and starting from a maximum extent in the direction parallel to the facet, the cavity narrows in the direction towards the facet and in the direction towards the light entrance side of the protective cover.

According to at least one embodiment, the laser radiation runs at a distance from the adhesive towards the light entrance side. That is, along a direct intended path from the radiation exit region to the light entrance side, the laser radiation does not reach the adhesive. This does not exclude that laser radiation possibly reflected at the light entrance side is guided to the adhesive.

According to at least one embodiment, the adhesive covers the light entrance side and optionally the side surface of the carrier partially or completely as well as directly and immediately over the entire radiation exit region. In other words, a continuous, gap-free connection can be formed solely by the adhesive between the facet and the light entrance side.

According to at least one embodiment, the entire light entrance side is covered by the adhesive. Likewise, the entire facet may be covered by the adhesive. The side surface of the carrier is preferably only partially covered by the adhesive, but alternatively can also be completely covered by the adhesive.

According to at least one embodiment, a difference in refractive index between the protective cover and the adhesive is at most 0.2 or 0.1 or 0.05 or 0.02. This applies in particular at a wavelength of maximum intensity of the laser radiation and at a temperature of 300 K. Reflections at an interface between the protective cover and the adhesive can be reduced by a correspondingly low refractive index difference.

According to at least one embodiment, the protective cover is made of at least one of the following materials or consists of one or more of these materials: glass, sapphire, silicon carbide. The protective cover is preferably made of sapphire.

According to at least one embodiment, the wavelength of maximum intensity of the laser radiation generated by the laser diode is at least 365 nm or 400 nm. Alternatively or additionally, the wavelength of maximum intensity is at most 530 nm or 460 nm or 440 nm, that is, the laser radiation is of a comparatively short wavelength.

According to at least one embodiment, the adhesive consists of one or more metals, in particular a solder, also in combination with metal layers on the protective cover and/or on the facet and the side surface on which the solder is applied. Alternatively, at least one glass is used for the adhesive.

The adhesive can be of homogeneous construction or can also be inhomogeneous. For example, in the case of a glass, it is possible for further particles to be introduced into a glass matrix, for example, as spacers and/or for setting thermal expansion coefficients.

According to at least one embodiment, the light entrance side of the protective cover is provided with a roughening. The light entrance side is thus designed to diffuse radiation reflected at the light entrance side in a diffuse manner such that the reflected laser radiation does not reach or reaches only attenuated to the radiation exit region. A feedback of the region between the facet and the protective cover to a resonator of the laser diode can thus be reduced.

According to at least one embodiment, the light entrance side is flat. In this case, the light entrance side lies obliquely with respect to the facet. For example, an angle between the light entrance side and the facet is at least 5° or 10° and/or at most 35° or 25° or 15°. As a result, laser radiation reflected at the light entrance side is kept away from the radiation exit region on the facet. The angle is preferably below a Brewster angle in order to keep an area of attack for diffusion on the adhesive low.

According to at least one embodiment, the protective cover is in the form of a lens and is biconvex such that the light entrance side extends in a curved manner, in particular in a continuously curved manner. A maximum curvature of the light entrance side is preferably located outside an optical axis of the laser radiation, such that any laser radiation possibly reflected at the light entrance side is kept away from the radiation exit region.

According to at least one embodiment, the light entrance side and/or the light exit side of the protective cover are partially or completely provided with an anti-reflection coating for the laser radiation. In particular, the light entrance side for the laser radiation has a reflectivity of at most 0.5% or 0.1% or 0.01%. Feedback of the region between the facet and the protective cover to the resonator of the laser diode can also be reduced or prevented by such an anti-reflection coating.

According to at least one embodiment, the light exit side of the protective cover facing away from the facet is provided with a catalytic coating, preferably with a photocatalytic coating. Said coating is designed to remove and/or decompose deposits on the light exit side by means of the laser radiation. The coating is formed in particular by a metal oxide such as titanium dioxide or zirconium oxide.

Alternatively, the coating is made of at least one metal such as platinum or palladium or rhodium. In the case of a metal coating for the catalytic coating, said coating preferably has a thickness of at most 10 nm or 5 nm or 3 nm, such that the laser radiation can pass through the catalytic coating without significant losses.

According to at least one embodiment, the light exit side of the protective cover is provided with an anti-adhesive coating. The anti-adhesive coating is designed to prevent deposits on the outside of the protective cover. The anti-adhesive coating is, for example, a plastic coating, in particular with a fluorine-carbon compound or a fluorine-silicon compound. The anti-adhesive coating is, for example, a fluorinated or perfluorinated polymer and/or a fluorinated or perfluorinated siloxane or silazane. Preferably the entire light exit side is coated accordingly.

According to at least one embodiment, the active zone is located on a side of the laser diode facing the carrier. For example, a distance between the active zone and the carrier is at most 5 µm or 10 µm or 3 µm. In contrast, the thickness of the laser diode is, for example, at least 20 µm or 50 µm or 100 µm and/or at most 0.5 mm or 0.2 mm.

According to at least one embodiment, the facet projects beyond the carrier along a running direction of the laser radiation. A projection of the laser diode over the carrier is, for example, at least 50 µm or 0.1 mm and alternatively or additionally at most 0.3 mm or 0.15 mm or 50 µm.

According to at least one embodiment, the semiconductor laser comprises one or more luminescent elements. The at least one luminescent element is designed for partial or complete conversion of the laser radiation and comprises one or more phosphors.

In particular, one or more of the following phosphors are used: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}:RE$ where X=halide, N or divalent element, D=trivalent or tetravalent element and RE=rare earth metals, such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs, for example, from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$ where RE=rare earth metals; nitrido orthosilicates such as $AE_{2-x-a}RE_xEu_a$-$SiO_{4-x}N_x$ or $AE_{2-x-a}RE_xEu_aSi_{1-y}O_{4-x-2y}N_x$ where RE=rare earth metal and AE=alkaline earth metal or such as $(Ba,Sr,Ca,Mg)_2SiO_4:Eu^{2+}$; chlorosilicates such as $Ca_8Mg(SiO_4)_4$ Cl$_2$:Eu$^{2+}$; chlorophosphates such as (Sr,Ba,Ca,Mg)$_{10}$(PO$_4$)$_6$ Cl$_2$:Eu$^{2+}$; BAM phosphors from the BaO—MgO—Al$_2$O$_3$ system such as BaMgAl$_{10}$O$_{17}$:Eu$^{2+}$; halophosphates such as M$_5$(PO$_4$)$_3$(Cl,F):(Eu$^{2+}$,Sb$^{2+}$, n$^{2+}$); SCAP phosphors such as (Sr,Ba,Ca)$_5$(PO$_4$)$_3$Cl:Eu$^{2+}$. In addition, so-called quantum dots can also be introduced as converter material. Quantum dots in the form of nanocrystalline materials which contain a group II-VI compound and/or a group III-V compounds and/or a group IV-VI compound and/or metal nanocrystals are preferred.

According to at least one embodiment, the luminescent element is located directly on the light exit side of the protective cover. The light exit side may be completely or only partially covered by the luminescent element. In this respect, direct means that the luminescent element touches the light exit side or that only a connecting means for attaching the luminescent element is located between the light exit side and the luminescent element. A distance between the luminescent element and the light exit side is preferably at most 10 μm or 5 μm or 2 μm.

Further, a production method for an optoelectronic semiconductor component such as a semiconductor laser is provided. Features with respect to the laser diode, the carrier, the protective cover, the luminescent element, the roughening, the anti-reflective coating, the catalytic coating and/or the anti-adhesive coating, as described above in connection with the semiconductor laser, are therefore also disclosed for the production method and vice versa.

In at least one embodiment, the production method for the optoelectronic semiconductor component comprises the following steps:

providing an optoelectronic semiconductor chip which has an active zone for generating a radiation and a radiation exit region, and subsequently producing a protective cover directly at the radiation exit region, wherein the protective cover is preferably made of a glass and is produced by means of hot stamping, and the semiconductor component is designed to be operated in a normal atmosphere without additional gas-tight encapsulation.

In particular, the semiconductor chip is a laser diode, as explained above, as an alternative to a light-emitting diode chip, LED chip for short. The semiconductor chip is preferably mounted on a carrier. The protective cover can be a lens for collimating the radiation, in particular the laser radiation.

According to at least one embodiment of the method, the protective cover directly contacts the side surface of the carrier, which preferably runs with a tolerance of at most 15° or 5° parallel to the facet. The facet may be completely covered by the protective cover, the side surface of the carrier is partially or completely covered by the protective cover.

A semiconductor laser described here and a production method described here are explained in more detail with reference to the drawing on the basis of exemplary embodiments. Identical reference symbols indicate identical elements in the individual figures. However, no relationships true to scale are shown here, but rather individual elements can be illustrated in an exaggerated manner for better understanding.

DETAILED DESCRIPTION

Figure 1A:
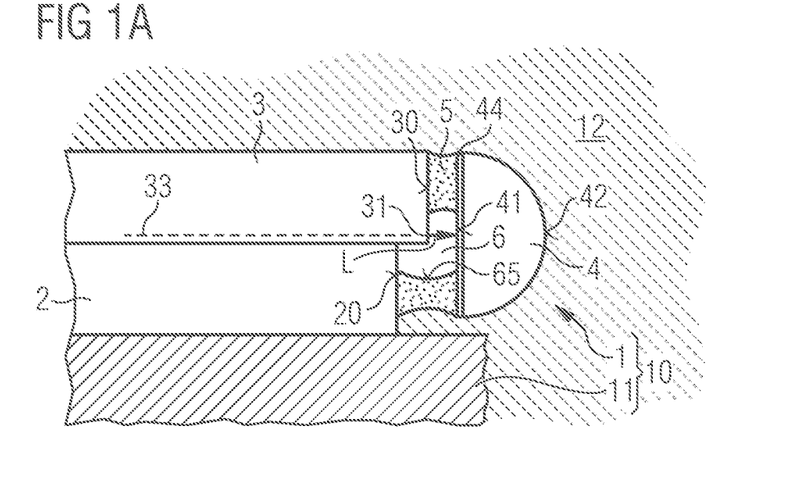
FIGS. 1A, 2 to 10 and 13 to 16 show schematic sectional views of exemplary embodiments of semiconductor lasers described herein.
Figure 1B:
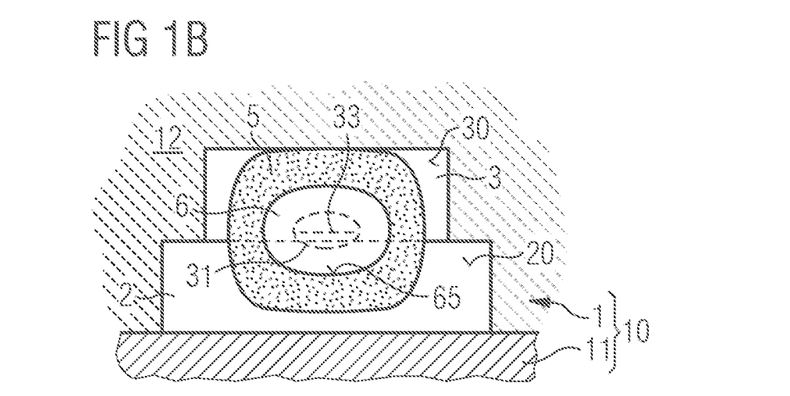
FIG. 1B shows a schematic plan view of a facet of an embodiment of a semiconductor laser described herein.

FIG. 1A shows a sectional view and FIG. 1B shows a top view of an exemplary embodiment of a semiconductor laser 1. The semiconductor laser 1 is preferably mounted on a heat sink 11 and, together with the heat sink 11, forms an arrangement 10. The arrangement 10 is located in normal ambient air 12. Thus, the arrangement 10 is not further encapsulated or hermetically sealed against ambient air 12.

The semiconductor laser 1 comprises a carrier 2, in particular a so-called submount. A laser diode 3 for generating a laser radiation L, which is, for example, blue light, is located on the carrier 2. For this purpose, the laser diode 3 has an active zone 33. The laser radiation L is emitted at a radiation exit region 31 at the active zone 33. A preferably planar facet 30 of the laser diode 3 is oriented approximately perpendicular to the active zone 33.

On the facet 30 and on a side surface 20 of the carrier 2 there is an adhesive 5 with which a protective cover is fastened. The protective cover is designed as a lens 4, preferably as a spherical lens, and has a light entrance side 41 facing the facet 30 and a light exit side 42 remote from the facet 30.

The, for example, elliptical radiation exit region 31 is enclosed all around by the adhesive 5 in a closed path in plan view, see FIG. 1B. In this case, in FIG. 1B, to simplify the illustration, the lens 4 is not shown, the protective cover 4 being able to close congruently with an outer contour of the adhesive 5, as is also possible in all other exemplary embodiments.

Thus, a cavity 6, which is closed off by the protective cover 4, is defined by the adhesive 5 on the facet 30. The cavity 6 is evacuated or filled with a protective gas. Side walls 65 of the cavity 6 which face the radiation exit region 31 are curved seen in cross-section so that the cavity 6 appears biconvex, see FIG. 1A.

Viewed from above, the radiation exit region 31 can be arranged centrally in the cavity 6, see FIG. 1B. The adhesive can have different widths in different directions around the radiation exit region 31. The adhesive 5 is preferably thin, so that an average distance between the facet 30 and the light entrance side 41 is preferably at most 5 μm. Optionally, an anti-reflection coating 44 for the laser radiation L is located at the light entrance side 41. The same applies preferably also to all other exemplary embodiments.

By means of the cavity 6 together with the adhesive 5 and the protective cover 4, the laser diode 3 is encapsulated in a facet-proximate manner. This encapsulation protects the radiation exit region 31 of the laser diode 3 from environmental influences and contamination. The encapsulation is thus limited locally to the region of the laser facet 30 itself and a surrounding mounting surface.

In the region of the facet 30, the encapsulation forms the cavity 6. The cavity 6 thus formed is hermetically encapsulated with respect to environmental influences. The optional protective gas or gas mixture is, for example, $H_2$, He, $N_2$, $He/O_2$. During the assembly of the protective cover 4, the radiation exit region 31 is recessed by a gap in the adhesive 5. There is thus no physical contact between the encapsulation element, formed from the protective cover 4 and the adhesive 5, and the radiation exit region 31, neither during assembly nor during operation of the semiconductor laser 1.

Due to the encapsulation close to the facet and a jump in the refractive index between the cavity 6 and the protective cover 4, potentially back reflections of the emitted laser radiation L can occur into a resonator of the laser diode 3 and can lead to disturbances of the resonator. In order to suppress this interaction, in particular the anti-reflection coating 44 is provided, for alternative or additional prevention possibilities of such interactions, see also the following FIGS. 2 and 3.

In order to produce the cavity 6, for example, a ring structure made of glass is applied to the laser diode 3 and the carrier 2, or alternatively to the protective cover 4, in particular to the light entrance side 41. For joining to the protective cover 4, the carrier 2 and the laser diode 3 are preferably brought to the required processing temperature. The joining takes place under the action of temperature and preferably of pressure.

Furthermore, it is possible to apply a glass sponge to the protective cover 4, which forms the adhesive 5. For this purpose, a glass powder/binder mixture is applied to the protective cover 4 by processes such as printing or dispensing. By means of a downstream temperature treatment, the binder is removed and the glass powder is sintered, also referred to as neck formation. The protective cover 4 thus prepared is then applied to the structure of the carrier 2 and the laser diode 3 by means of temperature and optionally pressure.

Alternatively, a glass sponge for the adhesive 5 can be produced by chemical processes. For this purpose, for example, an annular structure of a specially adapted glass is applied to the protective cover 4. The glass is demixed by targeted temperature storage on the microscopic scale, preferably in two or more phases. One of the phases can be dissolved wet-chemically from the remaining matrix. As described above, the sponge-like structure thus formed can be mounted on the carrier 2 and/or the laser diode 3 or also on the protective cover 4. The joining takes place accordingly.

Furthermore, it is possible, in particular, to apply structured metallizations on the protective cover 4 and the composite of the carrier 2 and the laser diode 3. A metallic joining element is attached for joining. The joining element is, for example, a solder, a metal sponge or a prefabricated metal ring. The joining takes place under the action of temperature and optionally with pressure.

By shaping the microcavity 6 in the region of the radiation exit region 31, there is no mechanical contact between the radiation exit region 31 and the protective cover 4. By means of this encapsulation close to the chip, significant miniaturization can be achieved in comparison to so-called TO housings.

Figure 2:
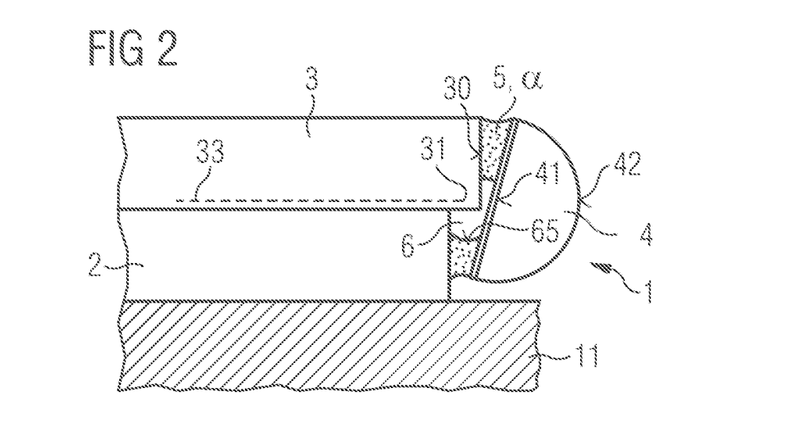

In the exemplary embodiment of FIG. 2, the protective cover 4 is applied in a tilted manner with respect to the laser diode 3. An angle α between the light entrance side 41 and the facet 30 is, for example, 10°.

A diameter of the protective cover 4, whose light entrance side 41 is planar in the present case and whose light exit side 42 is hemispherical, is, for example, between 0.2 mm and 0.8 mm inclusive, in particular around 0.4 mm. The same applies to all other exemplary embodiments.

Otherwise, the exemplary embodiment of FIG. 2 preferably corresponds to that of FIG. 1.

Figure 3:
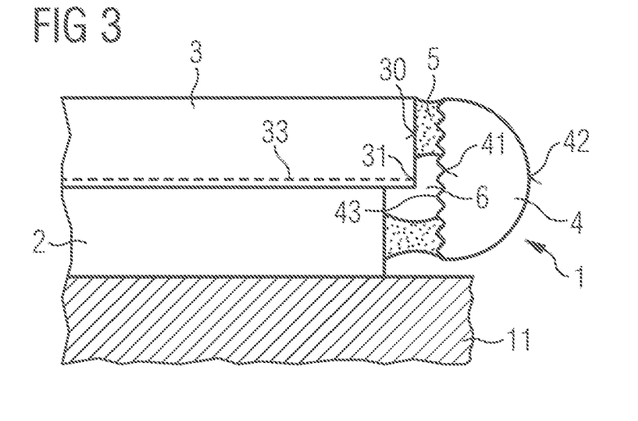

To prevent influences of the reflected laser radiation L, the protective cover 4 of the exemplary embodiment of FIG. 3 has a roughening 43 at the light entrance side 41. The roughening 43 can be of regular or irregular design. The roughening 43 can extend over the entire light entrance side 41 or can be restricted to a central region of the protective cover 4 which is assigned to the cavity 6. An average structural size of the roughening 43 is preferably at least 0.2 μm and/or at most 3 μm.

Possibilities for preventing influences by back-reflected laser radiation L on the resonator of the laser diode 3 are also explained in connection with FIGS. 4 to 8.

Figure 4:
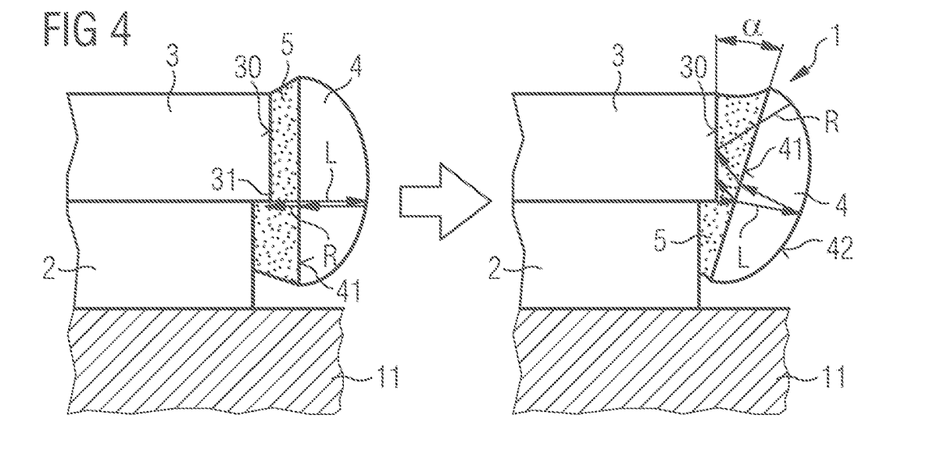

In FIG. 4, left-hand side, it is shown that laser radiation R reflected back in parallel to the facet 30 can reach the resonator of the laser diode 3. This is prevented by the oblique position of the protective cover 4 with respect to the laser diode 3, see FIG. 4, right side. The angle α between the facet 30 and the light entrance side 41 is preferably between 5° and 15° inclusive.

Figure 5:
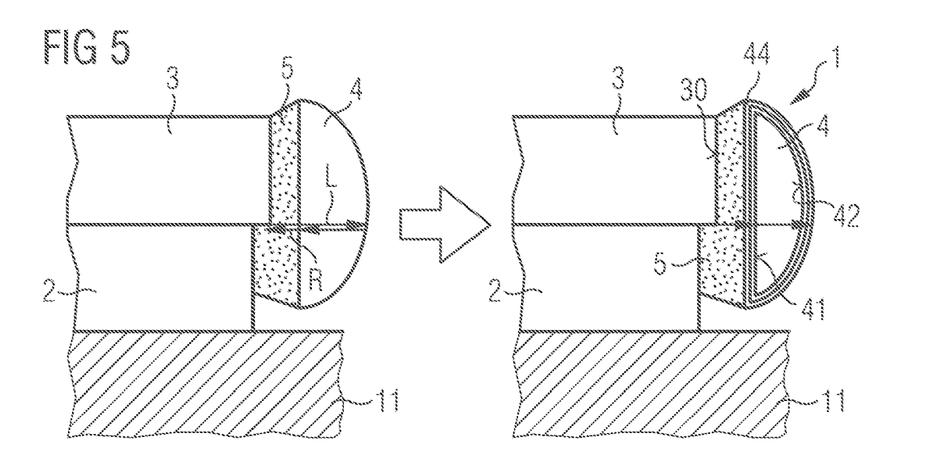

FIG. 5 illustrates that the back reflection R occurring in the left side of FIG. 5 is prevented in the right side of FIG. 5 by the anti-reflective coating 44. The anti-reflective coating 44 is formed, for example, by an alternating sequence of layers having a high and low refractive index, only schematically indicated in FIG. 5. The anti-reflective coating 44 can be attached both to the light entrance side 41 and to the light exit side 42 and thus can completely enclose the actual body of the protective cover 4. The same is also possible in the embodiment of FIG. 1.

As also in FIGS. 4 and 5, the adhesive 5 completely covers the radiation exit region 31, unlike as in FIGS. 1 to 3. Thus, no cavity is formed. The adhesive 5 is thus preferably formed to be permeable to the laser radiation L and in particular from a glass or from a glass mixture. The adhesive is thus, as well as is possible in all other exemplary embodiments, an inorganic component.

Figure 6:
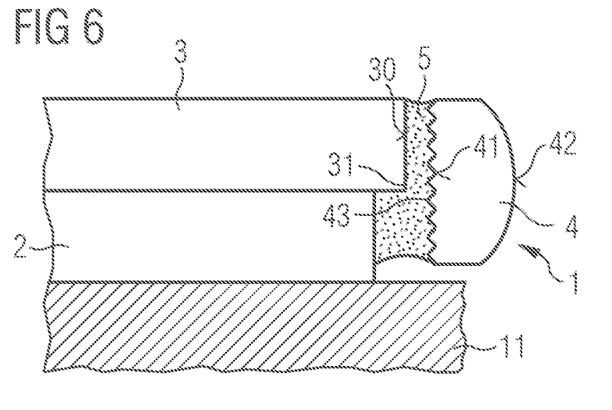

FIG. 6 illustrates that the roughening 43 is present at the light entrance side 41, analogous to FIG. 3, wherein the roughening 43 can also only partially cover the light entrance side 41, deviating from the illustration in FIGS. 3 and 6. The explanations with reference to FIG. 3 and also to FIG. 1 apply correspondingly to FIG. 6, except for the omission of the cavity.

As also in all other exemplary embodiments, it is possible for the protective cover 4 to have a straight side surface, as seen in cross section, between the light entrance side 41 and the light exit side 42. The lateral surface represents, for example, a cylindrical lateral surface.

Figure 7:
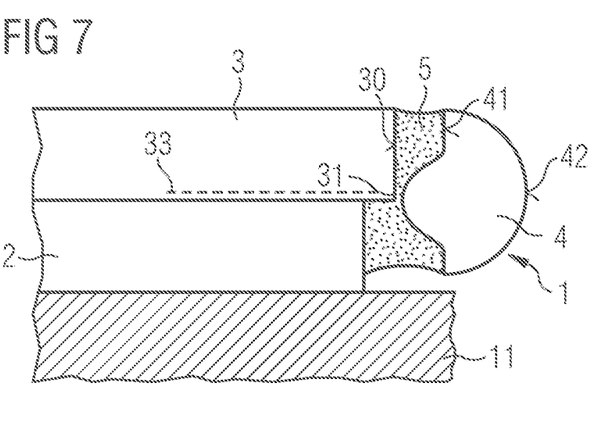

In FIG. 7, it is shown that the light entrance side 41 is specifically designed to prevent disturbing back reflections. For this purpose, the protective cover 4 has, viewed in cross-section, approximately a biconvex shape. A region of a maximum bulge of the light entrance side 41 is offset with respect to the active zone 33 and thus with respect to the radiation exit region 31, so that the light entrance side 41 is not oriented parallel to the facet 30 at the radiation exit region 31.

Figure 8:
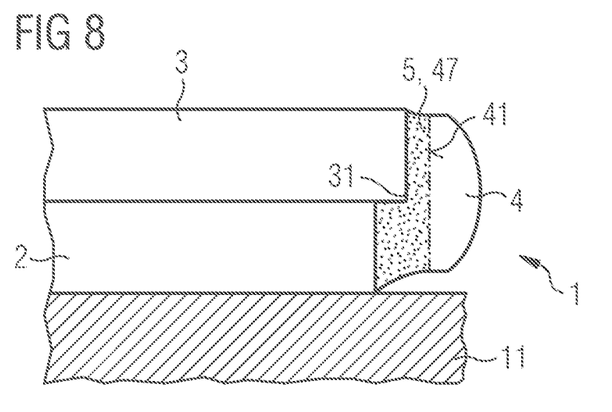

In the exemplary embodiment of FIG. 8, the adhesive 5 is designed as a refractive index matching layer 47. Thus, there is no or no significant jump in the refractive index between the adhesive 5 and the protective cover 4, symbolized by a dash-dotted line. Otherwise, the statements relating to the preceding exemplary embodiments apply correspondingly.

In the previous figures, in each case only one measure for preventing back reflections into the resonator of the laser diode 3 is drawn. These measures may also occur in combination. For example, the roughening 43 or the curved light entrance side 41 can be combined with an inclined position of the light entrance side 41. An anti-reflective coating 44 may also be present in each case. A refractive index matching layer 47 can also be used in the exemplary embodiments, in particular of FIGS. 5 to 7.

In particular in the design of FIG. 8, it is also possible for the adhesive 5 and the protective cover 4 to be of the same or very similar materials. However, the adhesive 5 preferably has a lower processing temperature than the protective cover 4.

By reducing or eliminating the optical interaction between the protective cover 4 and the resonator of the laser diode 3 in the case of the encapsulation close to the facet, additional degrees of freedom in the design are achieved. Especially, a miniaturized design is maintained.

Figure 9:
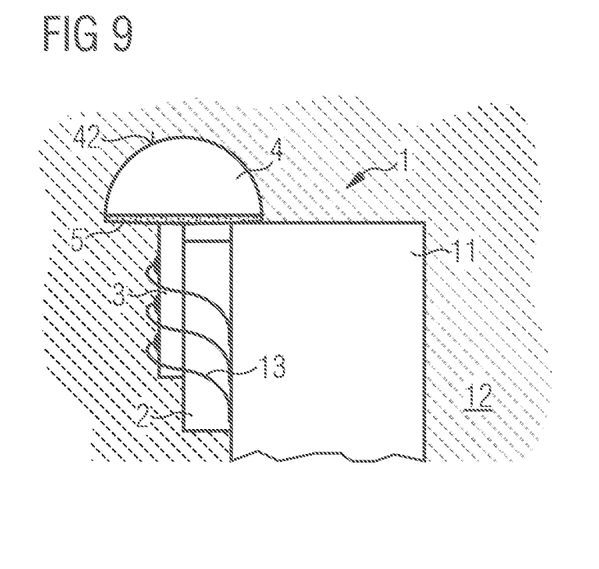

In the exemplary embodiment of FIG. 9, it is shown that the laser diode 3 is connected to the heat sink 11 via bonding wires 13, as can also be the case in all other exemplary embodiments. As is also possible in all other exemplary embodiments, the adhesive 5 can reach as far as the heat sink 11 and in this case also can extend at a distance from the carrier 2, or the carrier 2 is integrated in the laser diode 3.

A boundary surface accessible to the ambient air 12, at which the laser radiation L emerges, is significantly increased by the protective cover 4, which is used close to the facet. As a result, effects such as optical tweezers are reduced and the intensity of the laser radiation L at the interface, that is, at the light exit side 42, is reduced.

Otherwise, the statements relating to FIGS. 1 to 8 apply correspondingly to FIG. 9.

Figure 10:
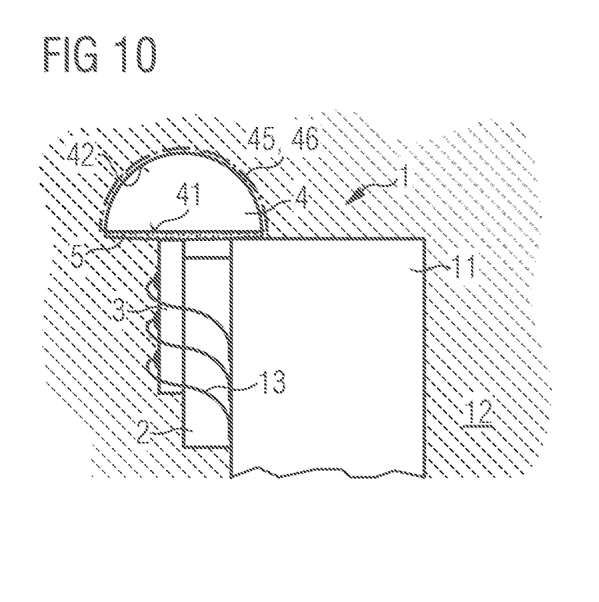

In FIG. 10, it is shown that the light exit side 42 is preferably completely covered by a photocatalytic coating 45 and/or by an anti-stick coating 46. The photocatalytic coating 45 is, for example, a thin platinum layer or a titanium dioxide layer. By means of such a coating 45, the thermodynamic equilibrium of the deposition of contaminations on the light exit side 42 of the protective cover 4 and the decomposition of potential deposits can be shifted in such a way that an accumulation of deposits is reliably reduced over the operating period of the semiconductor laser 1.

By applying the anti-stick coating 46, it is possible that no or no significant accumulation of impurities or burn-in of impurities takes place at the light exit side 42. The anti-stick coating 46 is preferably transparent to the laser radiation L. The anti-stick coating 46 is formed, for example, by a fluoropolymer such as polytetrafluoroethylene. Other possible materials for the anti-adhesive coating 46 are perylene derivatives such as perylene HT or sulfur compounds such as thiols-R-D-H or layer structures of carbon nanotubes.

The semiconductor components of, for example, FIG. 9 or 10 are preferably produced by adhesively bonding the protective cover 4 with a suitable adhesive 5 and optionally with subsequent heating processes and/or baking processes. Silicone-based adhesives having a very high purity and a low hydrocarbon content are suitable for adhering the protective cover 4. Any volatile additives present in such an adhesive 5 are optionally expelled by a temperature storage, in particular in the range from 180° C. to 300° C. Remaining hydrocarbons are, in turn, optionally driven out by a baking process under defined conditions with respect to a power of the laser radiation L and an ambient temperature.

Alternatively, it is possible to glue the protective cover 4 by means of a glass as an adhesive 5. In this case, a medium-melting glass is preferably used. The glass is applied either to one of the two surfaces to be joined or to both surfaces. The glass is preferably applied by liquid dispersion in the temperature range from 300° C. to 450° C. Following such dispensing, the protective cover 4 is mounted on the facet 30 of the laser diode 3, for example, by means of a gripping process, also referred to as pick and place.

Figure 11A:
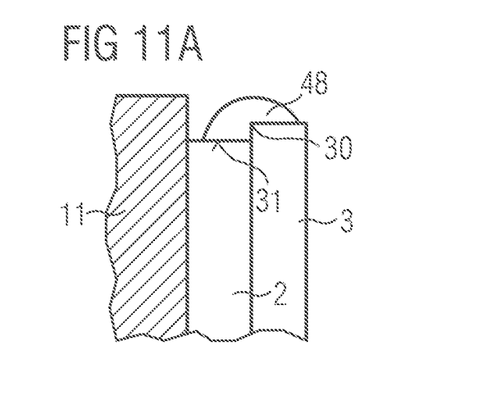
FIGS. 11A, 11B, and 11C and FIGS. 12A, 12B, and 12C show schematic sectional views of method steps for producing semiconductor lasers and optoelectronic semiconductor components described herein.
Figure 11B:
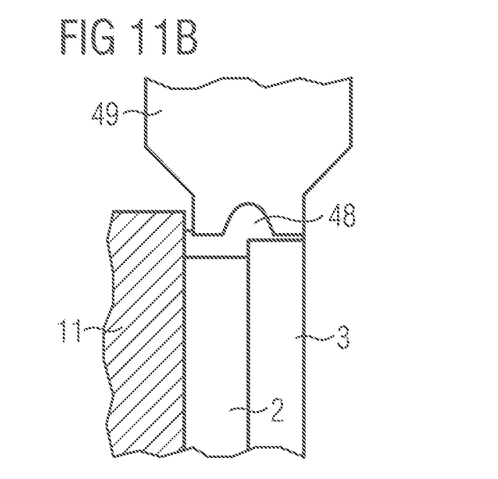
Figure 11C:
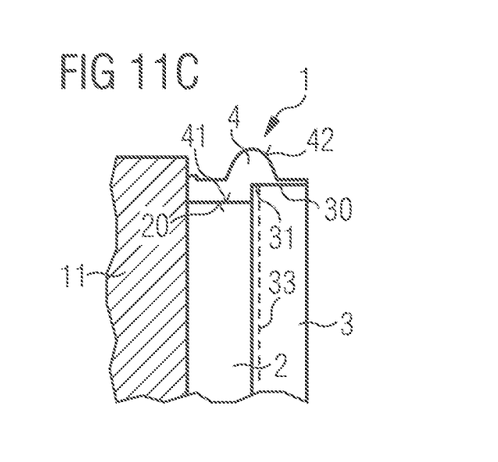

FIGS. 11A-11C show a production method for optoelectronic semiconductor components 1, a semiconductor laser 1 being produced according to FIGS. 11A-11C. In this case, it is possible entirely to dispense with the adhesive 5, as used in conjunction with FIGS. 1 to 10, and nevertheless to ensure a hermetic encapsulation of the radiation exit region 31.

For this purpose, see FIG. 11A, a raw material 48, preferably a glass, is applied to the facet 30 and/or to the side surface 20 of the carrier 2, in particular in liquid state by means of dispensing. Alternatively, a glass powder is applied, also referred to as a slip, wherein the glass powder is preferably applied in a binder solution. The application can be carried out by dispensing, spraying, printing or jetting and is preferably followed by a temperature storage step for debinding and compacting.

Alternatively, a glass bead is placed, followed by a targeted local temperature treatment for attachment analogously to a laser welding process, also referred to as a laser melting process. In the case of laser melting, the shape of the drop of glass can be influenced by local melting by a targeted adjustment of the energy density distribution in the beam profile, for example, by a Gaussian profile or a so-called top hat profile.

Examples of suitable glass compositions are in particular from the group of optical glasses, especially glasses having a low glass transition temperature of not more than 400° C., or glasses having a very low glass transition temperature of less than 300° C. Such glasses are preferably based on glass formers like tellurium oxide, $Te_2O_5$, boron trioxide, $B_2O_3$, silica, $SiO_2$, or bismuth oxide, $Bi_2O_3$. Suitable glass compositions preferably have a high proportion of network interrupters, for example ZnO and/or CaO. In order to stabilize such glass compositions or to keep a tendency to crystallize low, aluminum oxide, $Al_2O_3$, can optionally be added.

Such glasses can also be used for the adhesive 5, in particular of FIGS. 1 to 3, as well as for the adhesive 5, for example, for FIGS. 4 to 8.

Alternatively or additionally, heating of the laser diode 3 and/or of the carrier 2 with the adhesive 5 applied thereto is effected to a temperature at which, in particular, the glass has a viscosity which is sufficiently low for shaping by embossing. The embossing process with a hot stamping tool 49, which can preferably be heated, see FIG. 11B, preferably takes place at viscosities of the adhesive 5 in the range of $10^4$ dPa/s to $10^8$ dPa·s, preferably in the range of $10^4$ dPa·s to $10^5$ dPa·s.

The stamping tool 49 is made, for example, of platinum, gold, a platinum-gold alloy or graphite. In addition, tools 49 of hard metals are suitable. Examples of these are tungsten carbide or titanium carbide, in particular in a matrix of cobalt.

The hot stamping tool 49 may have a coating to prevent adhesion of the adhesive 5. Such a coating is, for example, TiN, AlN and/or TiAlN. Embossing tools 49 having a low surface roughness are preferably used, for example, with a roughness Ra of at most 100 nm. For this purpose, in particular surface-coated or surface-compacted graphite is suitable.

The applied protective cover 4 can be used for targeted beam shaping. Alternatively, the protective cover 4 can also be designed as refractive optics, as diffractive optics or as a combination of both. An optically effective structure of the protective cover 4 can be designed as a structure for increasing a light output, see also FIGS. 12A-12C.

The finished semiconductor component 1 is illustrated in FIG. 11C. In this case, it is possible for the entire facet 30 and the entire side surface 20 of the carrier 2 to be covered by the protective cover 4.

Figure 12A:
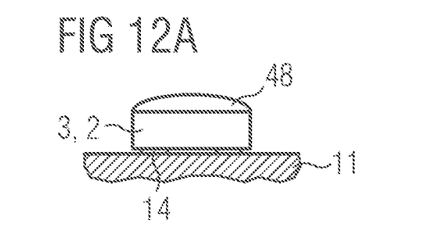
Figure 12B:
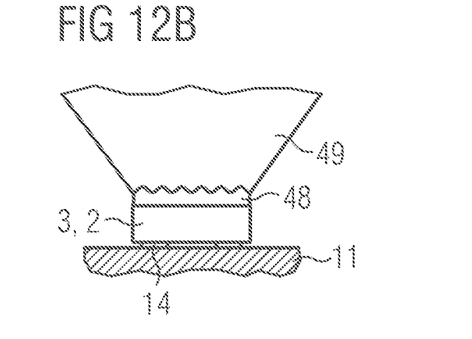
Figure 12C:
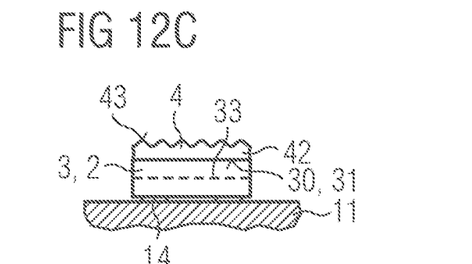

In the method of FIGS. 12A-12C, the optoelectronic semiconductor chip 3 is an LED chip, preferably with an integrated carrier 2 or alternatively with a separate carrier, not shown. Optionally, the semiconductor chip 3 is attached to a carrier 11 via connecting means 14, for example, adhesive points or solder points. Referring to FIG. 12A, the raw material 48 is applied to the protective cover 4.

Subsequently, see FIG. 12B, embossing is effected with the embossing tool 49, so that, as illustrated in FIG. 12C, the protective cover 4 results, for example, to improve light output. The protective cover 4 comprising a roughening 43 is thus formed on the light exit side 42. For this purpose, the protective cover 4 can have a refractive index similar to the semiconductor chip 3, for example, with a refractive index difference of at most 0.3, so that highly refractive raw materials 48 can be used for the protective cover 4.

Figure 13:
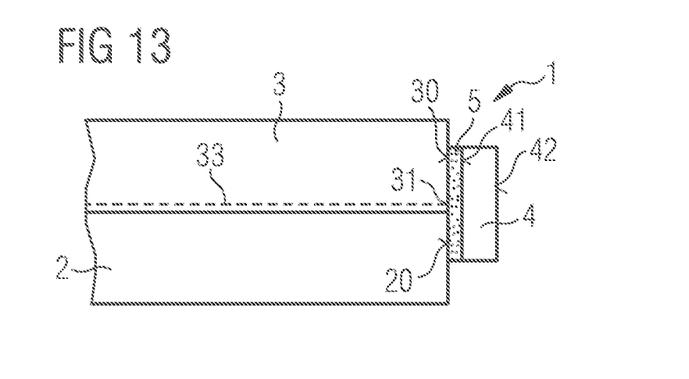

In the exemplary embodiment of FIG. 13, the protective cover 4 is designed as a plane-parallel, round disk and not as a lens. The facet 30 is only partially covered by the adhesive and terminates flush with the side surface 20. The same is possible in all other exemplary embodiments.

Figure 14:
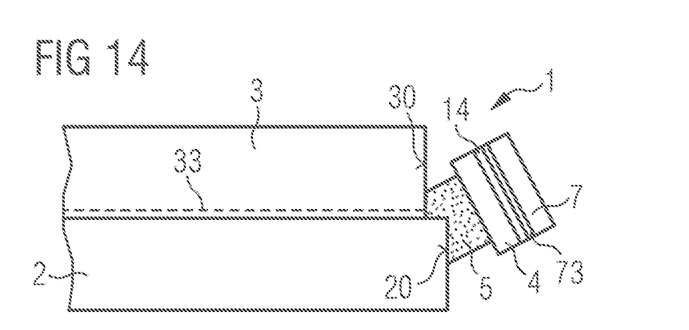

According to FIG. 14, a luminescent element 7 is attached to the protective cover 4, for example, in the form of a plane-parallel ceramic plate. Only the connecting means 14, for example, a thin layer of a silicone adhesive, in particular having a thickness of between 0.2 μm and 3 μm, is located between the, for example, plane-parallel protective cover 4 and the luminescent element 7.

The at least one phosphor for wavelength conversion can be limited to a region of the luminescent element 7 in which the laser radiation L generated during operation strikes the luminescent element 7. Optionally, a dichroic coating 73, which is transparent for the laser radiation L but reflects radiation generated in the luminescent element 7, is located on an entrance side 72 of the luminescent element 7 facing the laser diode 3.

Furthermore, it is possible for the carrier 2 to project beyond the facet 30. Thus, the protective cover 4 can be facing away from the carrier 2 and can run obliquely relative to the carrier 2. The same can be the case in all other exemplary embodiments.

Figure 15:
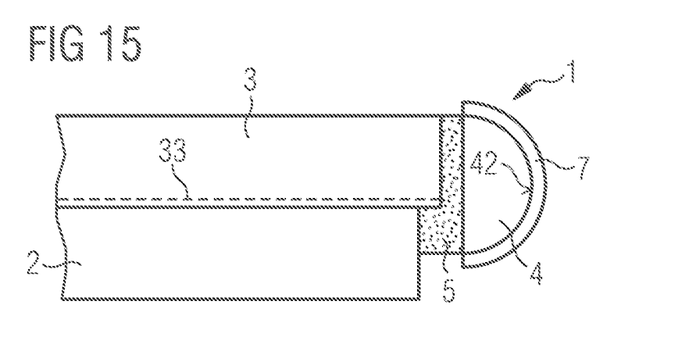

Likewise, in the exemplary embodiment of FIG. 15, the luminescent element 7 is present. In this case, the luminescent element 7 is applied directly and in particular over the entire surface of the light exit side 42, preferably with a constant, not varying thickness.

Such luminescent elements 7, as explained in FIGS. 14 and 15, can also be present in all other exemplary embodiments, preferably together with the dichroic coating 73.

In the configurations of FIGS. 13 to 15, measures for preventing back reflections into the resonator of the laser diode 3 can also be taken, in the same way as in FIGS. 1 to 8, individually or in combination with one another.

Figure 16:
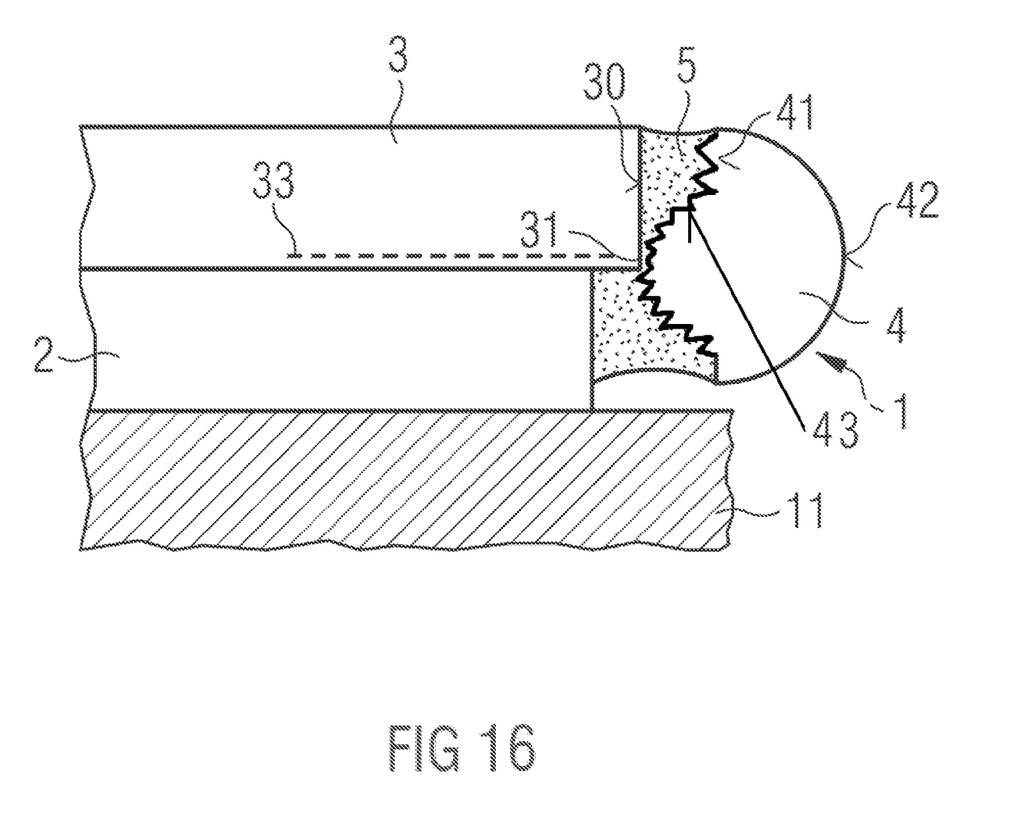

FIG. 16 illustrates that the roughening 43 is present at the light entrance side 41, analogous to FIG. 3, wherein the roughening 43 can also only partially cover the light entrance side 41, deviating from the illustration in FIGS. 3 and 6. The explanations with reference to FIG. 3 and also to FIG. 1 apply correspondingly to FIG. 6, except for the omission of the cavity.

As also in all other exemplary embodiments, it is possible for the protective cover 4 to have a straight side surface, as seen in cross section, between the light entrance side 41 and the light exit side 42. The lateral surface represents, for example, a cylindrical lateral surface.

Furthermore, it is shown in FIG. 16 that the light entrance side 41 is specifically designed to prevent disturbing back reflections. For this purpose, the protective cover 4 has, viewed in cross-section, approximately a biconvex shape. A region of a maximum bulge of the light entrance side 41 is offset with respect to the active zone 33 and thus with respect to the radiation exit region 31, so that the light entrance side 41 is not oriented parallel to the facet 30 at the radiation exit region 31.

Unless indicated otherwise, the components shown in the figures follow one another in each case directly in the specified sequence. Layers which are not in contact in the figures are preferably spaced apart from one another. If lines are drawn parallel to one another, the corresponding surfaces are preferably likewise aligned parallel to one another. Likewise, unless indicated otherwise, the relative positions of the illustrated components with respect to one another are correctly reproduced in the figures.

The invention described here is not limited by the description with reference to the exemplary embodiments. Rather, the invention comprises each novel feature and any combination of features, including, in particular, any combination of features in the claims, even if this feature or combination itself is not explicitly recited in the claims or embodiments.

This patent application claims the priority of German patent application 10 2017 123 798.4, the disclosure content of which is hereby incorporated by reference.

The invention claimed is:

1. A semiconductor laser comprising
a carrier,
an edge-emitting laser diode which is mounted on the carrier and which has an active zone for generating laser radiation and has a facet with a radiation exit region,
a protective cover, and
an adhesive, by means of which the protective cover is fastened to the facet and to a side surface of the carrier, wherein
an average distance between a light entrance side of the protective cover and the facet is at most 15 μm,
the semiconductor laser is configured to be operated in a normal atmosphere without additional gas-tight encapsulation, and
the protective cover is formed as a biconvex lens, wherein a maximum bulge of the light entrance side towards the facet lies outside an optical axis of the laser radiation such that laser radiation reflected at the light entrance side is kept away from the radiation exit region and/or such that a resonator of the laser diode remains undisturbed by the reflected laser radiation.

2. The semiconductor laser according to claim 1,
in which the protective cover is the biconvex lens for collimation of the laser radiation and has a minimum distance from the facet of 0.1 μm, and wherein a cavity is formed in the region of the active zone on the facet, said cavity is surrounded all around by the adhesive as seen in plan view of the facet, such that the radiation exit region, from which the laser radiation leaves the laser diode, is free of the adhesive.

3. The semiconductor laser according to claim 2, in which the cavity has side walls which are curved towards the adhesive such that the cavity has a biconvex shape in the radiation exit region when seen in cross-section perpendicular to the facet, and wherein the laser radiation runs at a distance from the adhesive towards the light entrance side.

4. The semiconductor laser according to claim 1, in which the adhesive directly covers the light entrance side, the side surface and the entire radiation exit region, and the protective cover is the biconvex lens for collimation of the laser radiation, and wherein the average distance between the light entrance side and the facet is between 0.2 µm and 15 µm inclusive.

5. The semiconductor laser according to claim 1, in which the protective cover comprises sapphire or SiC, and wherein a wavelength of maximum intensity of the laser radiation is between 365 nm and 530 nm inclusive.

6. The semiconductor laser according to claim 1, wherein the adhesive is inorganic and comprises or consists of at least one metal and/or at least one glass.

7. The semiconductor laser according to claim 1, in which the adhesive comprises or consists of a low-organic silicone, silazane and/or siloxane.

8. The semiconductor laser according to claim 1, in which the light entrance side is provided with a roughening such that the light entrance side is configured to diffuse reflected laser radiation and the reflected laser radiation does not pass or passes only attenuated to the radiation exit region and/or such that a resonator of the laser diode remains undisturbed by the reflected laser radiation.

9. The semiconductor laser according to claim 1, in which at least the light entrance side is provided with an anti-reflection coating for the laser radiation such that the light entrance side has a reflectivity of at most 0.5% for the laser radiation and/or such that a resonator of the laser diode remains undisturbed by the reflected laser radiation.

10. The semiconductor laser according to claim 1, in which at least one light exit side of the protective cover facing away from the facet is provided with an anti-adhesive coating, and wherein the anti-adhesive coating is configured to prevent deposits on an outside of the protective cover.

11. The semiconductor laser according to claim 1, in which the active zone is located on a side of the laser diode facing the carrier, and wherein the facet projects beyond the carrier along a running direction of the laser radiation.

12. The semiconductor laser according to claim 1, further comprising a luminescent element for partially converting the laser radiation such that the semiconductor laser emits white mixed light during operation, wherein the luminescent element is located directly on the light exit side.

13. The semiconductor laser according to claim 1, wherein the entire light entrance side is covered by the adhesive and a refractive index difference between the protective cover and the adhesive at a wavelength of maximum intensity of the laser radiation and at 300 K is at most 0.1.

* * * * *